United States Patent
Bahl et al.

(10) Patent No.: US 9,631,279 B2
(45) Date of Patent: Apr. 25, 2017

(54) METHODS FOR FORMING EMBEDDED TRACES

(71) Applicants: Kenneth S. Bahl, Saratoga, CA (US); Konstantine Karavakis, Pleasanton, CA (US); Steve Carney, San Jose, CA (US)

(72) Inventors: Kenneth S. Bahl, Saratoga, CA (US); Konstantine Karavakis, Pleasanton, CA (US); Steve Carney, San Jose, CA (US)

(73) Assignee: Sierra Circuits, Inc., Sunnyvale, CA (US)

( * ) Notice: Subject to any disclaimer, the term of this patent is extended or adjusted under 35 U.S.C. 154(b) by 0 days.

(21) Appl. No.: 14/297,516

(22) Filed: Jun. 5, 2014

(65) Prior Publication Data

US 2015/0334825 A1    Nov. 19, 2015

Related U.S. Application Data

(63) Continuation-in-part of application No. 14/281,631, filed on May 19, 2014, now Pat. No. 9,380,700.

(51) Int. Cl.
*H05K 3/10* (2006.01)
*C23C 18/16* (2006.01)
(Continued)

(52) U.S. Cl.
CPC ........ *C23C 18/1608* (2013.01); *C23C 18/204* (2013.01); *C23C 18/38* (2013.01);
(Continued)

(58) Field of Classification Search
CPC .... H05K 1/0298; H05K 3/187; H05K 3/4038; H05K 3/465; H05K 3/4661; H05K 1/115; H05K 3/185; H05K 3/107; H05K 1/03; H05K 2203/107; H05K 2203/0228; H05K 2203/072; H05K 2203/10;
(Continued)

(56) References Cited

U.S. PATENT DOCUMENTS 3,259,559 A    7/1966  Schneble, Jr. et al.
3,546,009 A   12/1970  Schneble, Jr. et al.
(Continued)

FOREIGN PATENT DOCUMENTS

EP    1367872 A2   12/2003
EP    2420593 A1    2/2012
(Continued)

OTHER PUBLICATIONS

International Search Report and Written Opinion of the International Searching Authority for related application PCT/US2015/014599 mailed on May 28, 2015.
(Continued)

*Primary Examiner* — Donghai D Nguyen
(74) *Attorney, Agent, or Firm* — Douglas L. Weller

(57) ABSTRACT

A printed circuit board includes a laminate substrate. The laminate substrate includes catalytic core material that resists metal plating except where a surface of the catalytic material is ablated. Metal traces are formed within in trace channels within the laminate substrate. The channels extend below the surface of the catalytic material.

20 Claims, 4 Drawing Sheets

(51) Int. Cl.
*C23C 18/38* (2006.01)
*C23C 18/20* (2006.01)
*H05K 3/18* (2006.01)
*H05K 3/46* (2006.01)

(52) U.S. Cl.
CPC ........... *H05K 3/185* (2013.01); *H05K 3/4602* (2013.01); *H05K 2201/0236* (2013.01); *H05K 2201/0376* (2013.01); *H05K 2203/025* (2013.01); *H05K 2203/0716* (2013.01); *H05K 2203/107* (2013.01); *Y10T 29/49165* (2015.01)

(58) Field of Classification Search
CPC . H05K 2201/09509; H05K 2201/0236; H05K 2201/0376; H05K 2203/0716; C23C 18/38; C23C 18/204; C23C 18/1608; Y10T 29/49126; Y10T 29/49155; Y10T 29/49165
USPC .......... 29/830, 831, 846, 852; 174/262, 258; 216/13, 17; 427/98.5, 99.1
See application file for complete search history.

(56) References Cited

U.S. PATENT DOCUMENTS

| | | | | |
|---|---|---|---|---|
| 4,287,253 | A * | 9/1981 | Leech | ..................... C23C 18/28 174/258 |
| 5,162,144 | A | 11/1992 | Brown et al. | |
| 5,260,170 | A * | 11/1993 | Brown | ..................... G03F 7/002 427/98.5 |
| 5,272,600 | A | 12/1993 | Carey | |
| 5,340,746 | A | 8/1994 | Hagen et al. | |
| 5,419,954 | A * | 5/1995 | Lane | ......................... B32B 5/08 428/901 |
| 5,470,532 | A | 11/1995 | Hagen et al. | |
| 6,452,278 | B1 | 9/2002 | DiCaprio et al. | |
| 7,334,326 | B1 | 2/2008 | Huemoeller et al. | |
| 7,752,752 | B1 * | 7/2010 | Rusli | ...................... H05K 3/045 29/852 |
| 8,187,478 | B2 * | 5/2012 | Liu | .......................... H05K 3/107 29/846 |
| 2004/0224252 | A1 | 11/2004 | Kondo et al. | |
| 2006/0055021 | A1 | 3/2006 | Yamamoto | |
| 2006/0057341 | A1 | 3/2006 | Kawabata et al. | |
| 2006/0068173 | A1 | 3/2006 | Kajiyama et al. | |
| 2007/0014975 | A1 | 1/2007 | Ota | |
| 2009/0120660 | A1 | 5/2009 | Park et al. | |
| 2010/0266752 | A1 | 10/2010 | Tseng et al. | |
| 2011/0048783 | A1 | 3/2011 | Yu | |
| 2012/0074094 | A1 | 3/2012 | Chiang et al. | |

FOREIGN PATENT DOCUMENTS

| | | |
|---|---|---|
| EP | 2420593 B1 | 2/2012 |
| EP | 2584064 A2 | 4/2013 |
| WO | 2009006010 A2 | 1/2009 |
| WO | 2012127205 A1 | 9/2012 |
| WO | WO 2012/127205 A1 | 9/2012 |

OTHER PUBLICATIONS

International Search Report and Written Opinion of the International Searching Authority for related application PCT/US2015/014619 mailed on Jun. 5, 2015.

M-CAM International, LLC., Sierra Circuits Innovation Data Analysis, Appendix C—Selected Art of Interest for U.S. Appl. No. 14/281,631, and Continuation, 2015.

PCT International Preliminary Report on Patentability for PCT Application PCT/US2015/014599, Nov. 22, 2016.

\* cited by examiner

METHODS FOR FORMING EMBEDDED TRACES

BACKGROUND

In a typical printed circuit board (PCB) fabrication process, copper clad laminate with copper on both sides of the PCB can be used. A photoimagable resist is applied on both sides of the PCB and exposed and developed to create the circuitry. The unwanted copper between the circuitry is then removed using copper chemical etching solutions. The resist is then chemically removed. For multilayer constructions, glass reinforced not fully cured resin prepregs can be placed on both sides of a finished core and laminated under heat, vacuum and pressure using copper foil on both sides of the PCB. Hole formation can be performed using mechanical means such as drilling or lasers to create blind vias to interconnect the outer layers to the inner ones. Prepregs, if not already impregnated with a synthetic resin, can be reinforced with a synthetic resin.

DESCRIPTION OF THE EMBODIMENT

In printed circuit board (PCB) fabrication where traces are formed above a laminate surface by 0.5-2.5 mils, there is a potential that voids can be entrapped between the traces during a prepreg lamination or during a solder mask application if the PCB is a two-layer board. In addition, signal integrity and conductor impedance are functions of the dielectric spacing between traces. When PCB traces are formed above a laminate surface, dielectric space above the PCB traces will vary across the length and width of the board. This makes it difficult to accurately control impedance of the PCB traces. Also, when PCB traces are formed above a laminate surface and trace widths and spaces are less than one mil, failures of fine trace lines to properly adhere to the laminate surface can cause both poor yields in fabrication and reliability issues. For example, when forming traces on the substrate surface, the geometry of the traces can vary across the length of the traces due to inaccuracies introduced by the limitations of photolithography and chemical copper etching. Varying geometries of traces can create poor signal propagation and trace impedance.

Figure 1:
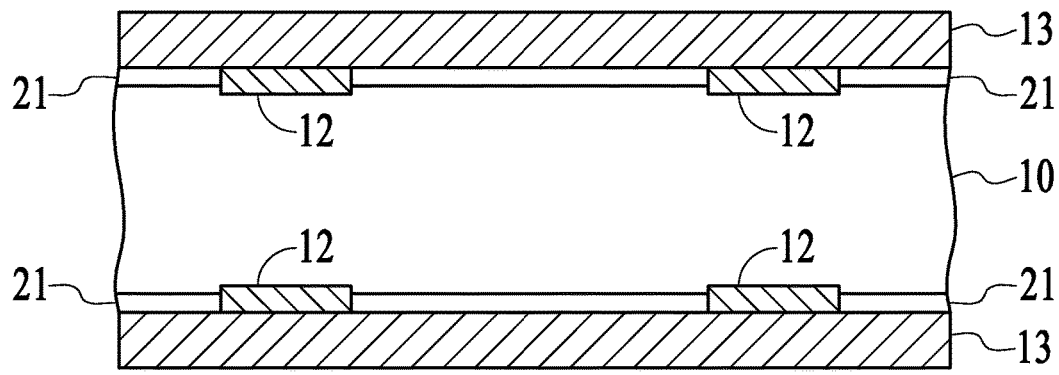
FIG. 1 shows a simplified diagram illustrated a printed circuit board structure with embedded traces in accordance with an implementation.

In order to solve the above issues that arise when PCB traces are formed above a laminate surface, PCB traces are embedded in a laminate substrate so that the PCB traces do not extend above the laminate surface. This is illustrated in FIG. 1 where PCB traces 12 are embedded within laminate substrate composed of a catalytic core material 10 over which has been non-catalytic material 21. For example, non-catalytic material 21 is a thin non-catalytic adhesive or dielectric layer. For example, non-catalytic material 21 can be composed of an ultraviolet (UV) curable material such as a solder mask or some other type of UV curable material. The UV curable material can be exposed to UV light to fully cure it followed by channel formation through it. Alternatively, the UV curable material can be exposed and developed to form the channels and then a laser can be used to cut channels into the resulting surface surface. A next layer 13 can be, for example, a solder mask for a two-layer PCB board, or a prepreg lamination layer for a PCB board that includes more than two-layers or a non-glass reinforced catalytic adhesive.

PCB traces 12 are formed in channels with a depth, for example, between 0.25 and 2.5 mils. The channels are ablated in the surface of catalytic core material 10. Embedding PCB traces 12 provides for better electrical performance since the geometry of the PCB traces is very well controlled by the channel formation process. Also, embedding PCB traces 12 in catalytic core material 10 solves the adhesion problem that arises when traces are very fine, for example, when trace thickness and space between traces is less than one mil. When PCB traces are embedded they are constrained on three sides by laminate surfaces.

Figure 2:
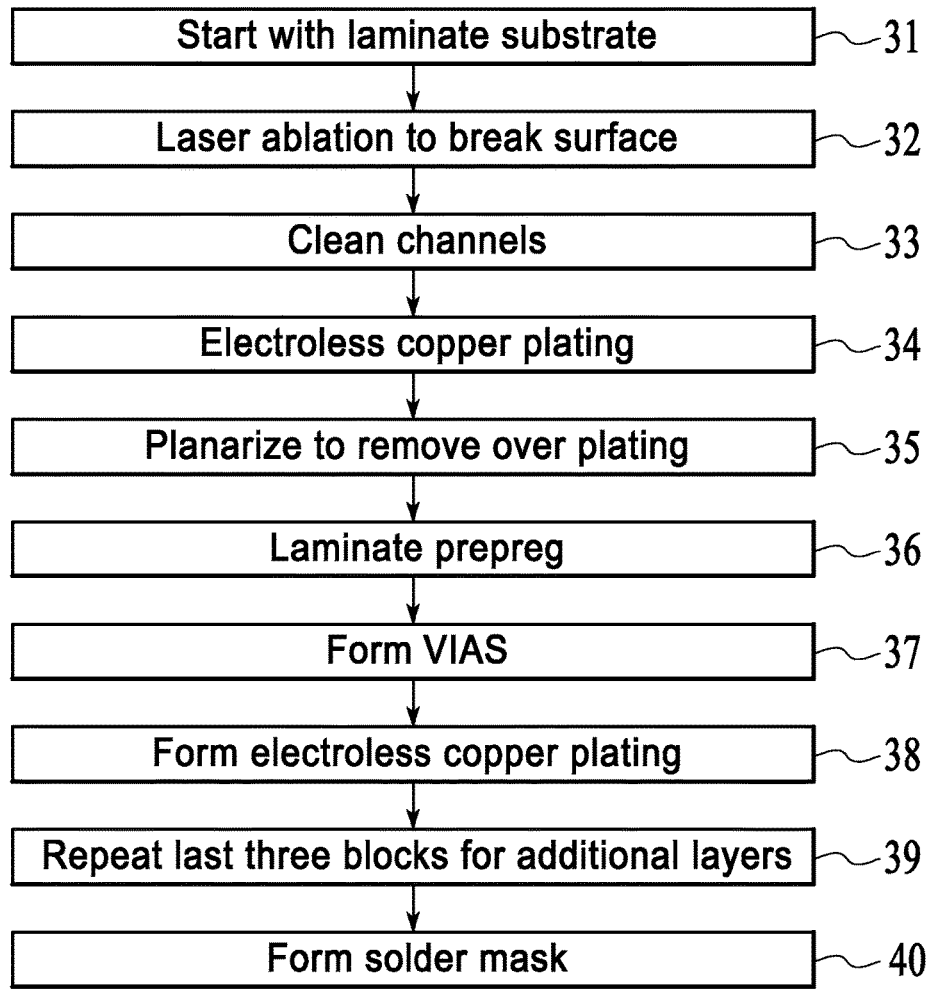
FIG. 2 sets out a simplified flowchart that summarizes a process for fabricating a printed circuit board with embedded traces in accordance with an implementation.
Figure 3:
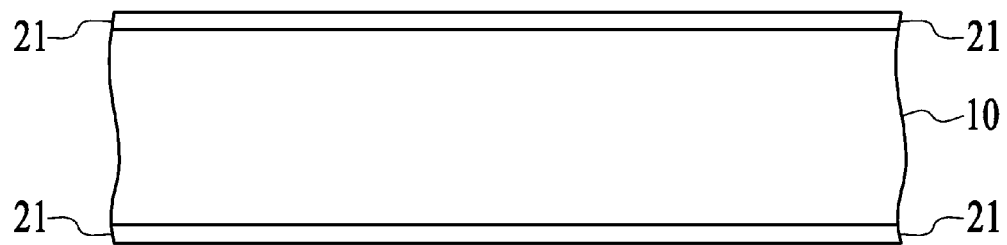
FIG. 3, FIG. 4, FIG. 5, FIG. 6, FIG. 7, FIG. 8, FIG. 9 and FIG. 10 illustrate steps in a process for fabricating a printed circuit board with embedded traces in accordance with an implementation.

FIG. 2 sets out a simplified flowchart that summarizes a process for fabricating a printed circuit board with embedded traces. In a block 31, the process starts with a laminate substrate. For example, the laminate substrate has a catalytic core. For example, the catalytic core material includes palladium powder that includes palladium catalytic particles made out of inorganic fillers primarily Kaolin. For example, the inorganic fillers are produced by contacting a salt palladium, at the surface of a filler such as aluminum silicate, and clays such as Kaolin with a reducing agent. Alternatively, instead of salt of palladium, salt of another metal such as silver can be used.

Hydrazine hydrate can be used as a reducing agent to reduce the palladium salt to palladium metal. The filler can be added into a mixing tank with water in a form of slurry and then a palladium chlorine (PdCl) and hydrochloric acid (HCl) solution added into the mixture followed by the hydrazine hydrate. For more information on making such a catalytic power, see U.S. Pat. No. 4,287,253.

The catalytic powder can be dispersed in an epoxy resin well. The epoxy resin with the catalytic filler in it can be used to impregnate a glass cloth with resin and catalyst using conventional glass cloth coating and drying equipment. The coated semi-cured resin/glass cloths can be used to make laminates for printed circuit boards by pressing the coated semi-cured resin/glass cloths together under standard vacuum laminating equipment.

Once the catalytic core material has been formed, non-catalytic material can be used to encompass the catalytic core material. For example, the non-catalytic material is composed of a thin non-catalytic adhesive or dielectric layer applied on both sides of the catalytic core material. This coating can be applied, for example, by roller coating, by curtain coating, by stenciling, by screen printing, or by some other standard or nonstandard coating process. The thickness of the resulting non-catalytic material is, for example, in the range of approximately 0.25-1.5 mils. After application the coating can be cured.

Alternatively, the non-catalytic material can be formed on both sides of a catalytic core material by placing a non-catalytic prepreg(s) on the outer portions of the catalytic prepregs during the lay-up and prior to lamination. This structure will create catalytic core material encompassed by non-catalytic material. The non-catalytic material can be, for example, a glass reinforced prepreg, B-staged (not fully cured) dielectric adhesive which can optionally be filled with inorganic fillers.

The resulting layered laminate material can be used as a laminate substrate for a printed circuit board.

For example, catalytic core material 10 is of any thickness between, for example, two and sixty mils. For example, catalytic core material 10 is composed of a non-clad catalytic base laminate with outside prepregs that are resin rich so that after vacuum lamination the resulting finished laminate has a resin rich surface. For example, resin rich prepregs can have (but are not limited to) a glass style 106 with 71% resin content or a glass style 1035 with 65% resin content. Using a resin rich laminate surface assures that when channels are made, primarily resin is removed and not glass. This can speed up the channel formation process and improve the quality of the channel.

Non-catalytic material 21 is formed on both sides of catalytic core material 10. Non-catalytic material 21 is, for example, composed of a glass reinforced prepreg, B-staged (not fully cured) dielectric adhesive. For example, the dielectric adhesive is filled with inorganic fillers.

The advantage of a laminate substrate composed of catalytic core material surrounded by non-catalytic material is that during the formation of the channels the non-catalytic material will be cut first followed by the catalytic core material. The depth of the channel in the catalytic core material can be controlled much easier since it is not necessary to go very deep in the catalytic core material. Such a shallow cut in the catalytic core material reduces the risk of cutting glass bundles within the catalytic core material. For example, for a laminate substrate composed of a filled non-catalytic dielectric of 0.5 mils on the surface of catalytic core material where a channel will have a total of 0.7 mil depth, then only about 0.2 mils of the catalytic core material need be removed to expose sufficient active catalytic particles for copper to plate.

Figure 4:
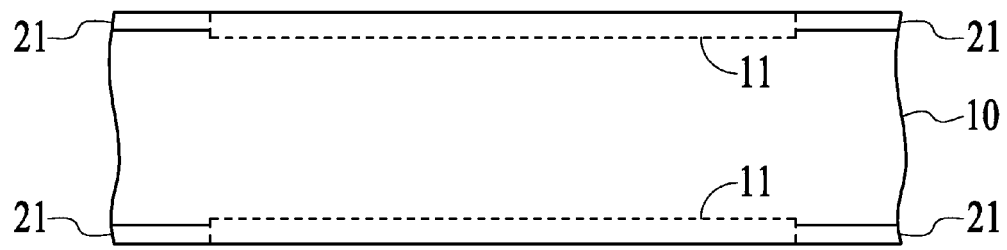

In a block 32, laser ablation is used to break the surface of non-catalytic material 21 and catalytic core material 10 to form channels 11, as shown in FIG. 4. The laser ablation can be accomplished, for example, with an ultraviolet (UV) excimer laser, with a Yttrium aluminum garnet (YAG) laser, with a UV YAG laser or with some other type of laser, or alternatively, a non-laser ablation process. Excimer laser ablation creates good depth control and channel resolution.

As an alternative to using laser ablation to form channels, resist can be applied on both sides of non-catalytic material 21. The resist is exposed and developed to delineate locations of the channels. For example, resist thickness is thicker than the depth of the channels. For example, for a channel depth of 0.5 mils, resist thickness can be 1.0 to 1.5 mils. The formation of the channels can then be performed using plasma etching with a combination of gasses (e.g., O2, CF4, Ar, etc.) along with the proper power and duration. It is expected the channel will be etched at a different rate than the resist. For example, the resist thickness should be sufficiently thicker that the channel depth so that when the channel depth is reached there is some resist left protecting unexposed regions of the surfaces of non-catalytic material 21. After plasma etching, the remaining resist can be removed by a resist stripper.

Alternatively, instead of protecting the surface of laminate substrate with resist when performing plasma etch, other protective material can be used. For example, the protection can be accomplished using a foil, such as a copper foil or aluminum foil, that gets applied to non-catalytic material 21. The shiny side of the foil can be placed facing non-catalytic material 21 so the foil can be peeled off after channel formation. For example, after applying the foil to non-catalytic material 21, resist will be applied over the foil. The resist is exposed/develop to expose the foil over the channel regions. The foil is etched to expose the channel regions in non-catalytic material 21. The remaining resist is then stripped and the channels are plasma etched. The remaining foil is peeled off and processing continues.

Alternatively, channels can be formed using high pressure water cutting. The high pressure water cutting can be performed using programmable high pressure water cutting machines such as those used for cutting hard materials such as steel and stainless steel. Another mechanical processes such as drilling and routing can be used for making the channels.

In a block 33, the laminate substrate is cleaned to remove debris from channels 11. For example, the cleaning can be accomplished by an ultrasonic rinse using acoustic wave with a frequency within the range of 40 to 160 megahertz (MHz). In the absence of non-catalytic layer, a more aggressive chemical cleaning would typically not used as an aggressive chemical cleaning may result in the surface of catalytic core material 10 being roughened or etched. If the surface of catalytic core material 10 is etched this can result in metal plating at locations not within formed channels. However, with non-catalytic material 21 over the surface of catalytic core material 10, a more aggressive chemical cleaning can be used as etching a bit of the surface of non-catalytic material 21 should not result in metal plating at locations not within formed channels.

Figure 5:
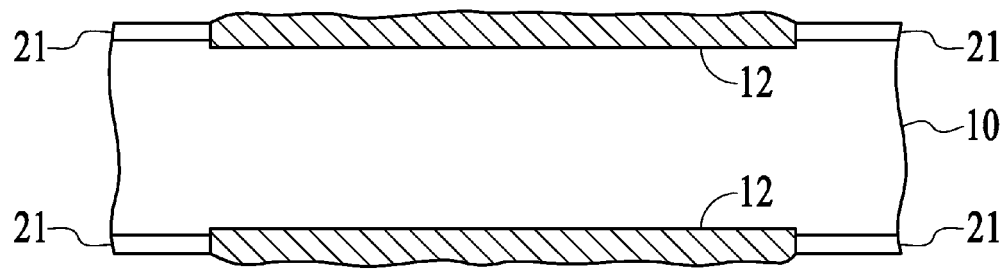
Figure 6:
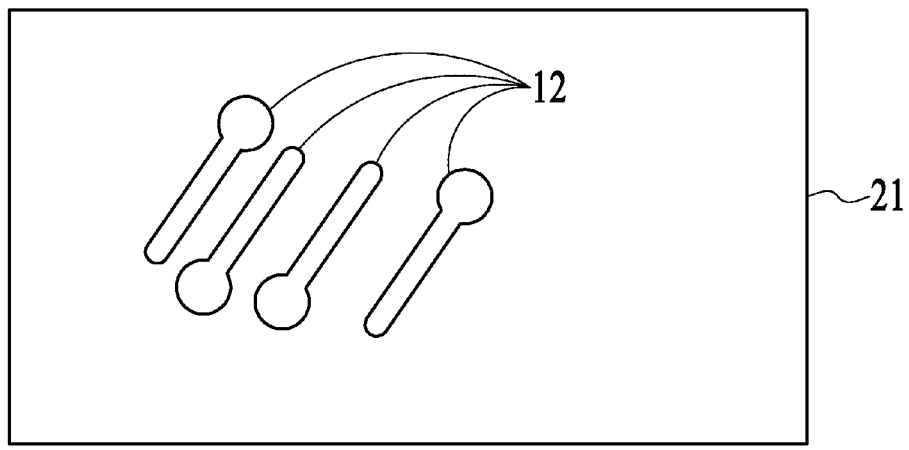

In a block 34, traces 12 are formed in channels 11, as illustrated by FIG. 5. For example, traces 12 are a metal such as copper. For example, to form copper traces, non-catalytic material 21 and catalytic core material 10 are immersed into a fast electroless copper bath. Channels 11 are plated all the way up and slightly above the surface of non-catalytic material 21. The electroless copper bath plates only on the exposed catalytic areas that were exposed by the ablation process. No copper plates outside channels 11 since during the lamination process of making catalytic core material 10 the copper catalyzes only at locations where the surface of the catalytic core material 10 where the surface is ablated, scratched or roughened. As a result copper traces form where ablation has penetrated the surface of catalytic core material 10. A simplified top view of traces within the laminate substrate is shown in FIG. 6.

Figure 7:
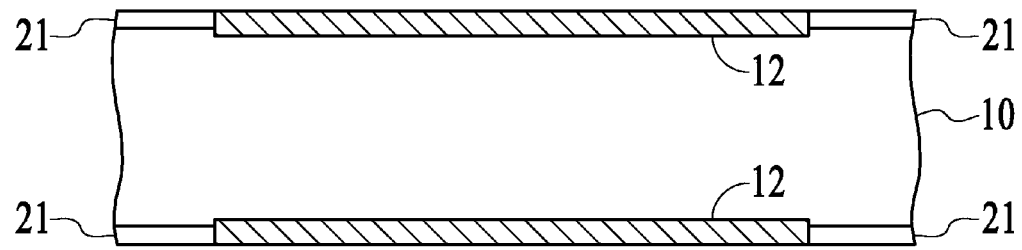

In a block 35, the surfaces of non-catalytic material 21 are planarized, for example, using fine grid sandpaper (e.g., 420 grit to 1200 grit). The planarization removes any excess copper that extends above the channels. For example, a planarization machine such as those produced by MASS, Inc., can be used. The resulting planarization is illustrated in FIG. 7. For a two-layer PCB board, a solder mask is applied. For example, the PCB may be finished by performing selective gold plating followed by singulation and inspection.

Figure 8:
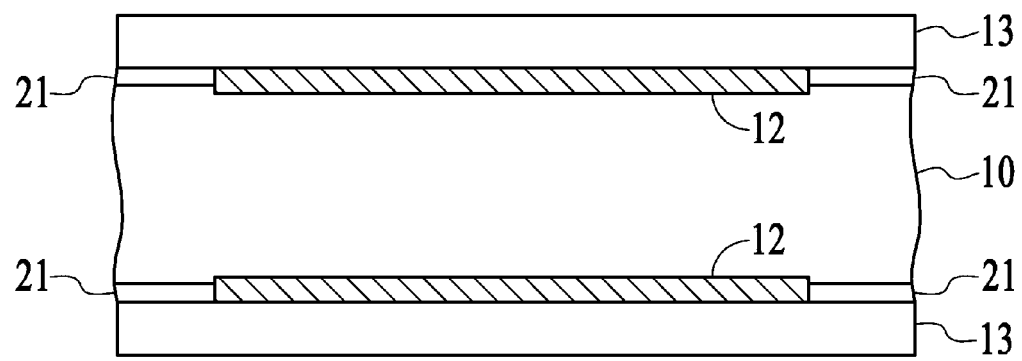

When the PCB board will have more than two layers, in a block 36, a resin rich catalytic prepreg material 13 is laminated on both sides of the laminate substrate. For example, a release film such as tedlar or Teflon is used. The result is shown in FIG. 8. Alternative to using resin rich catalytic prepreg material 13, a not catalytic material can be used such as a catalytic adhesive material implemented, for example, as a layer of non-glass reinforced catalytic adhesive.

Figure 9:
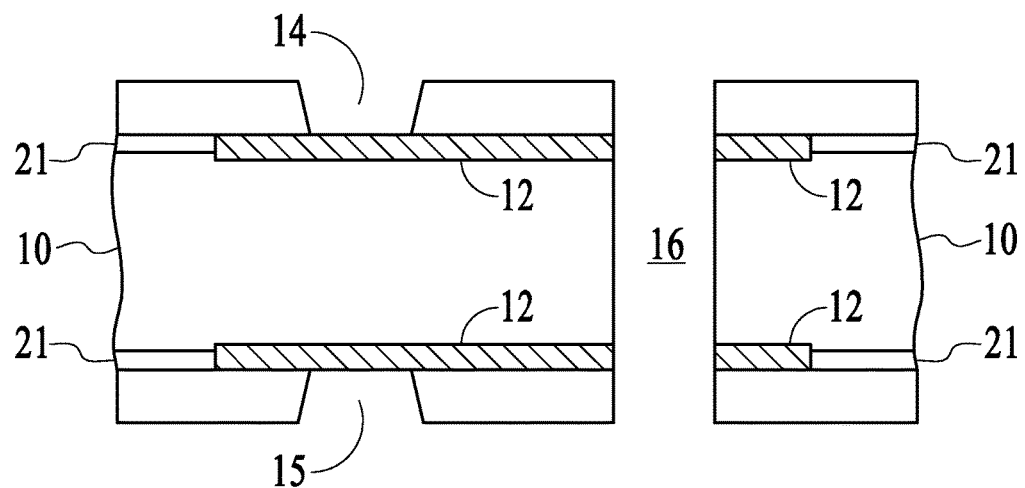

In a block 37, blind and through vias are formed, for example by use of laser or mechanical means such as a drill. The result is illustrated by FIG. 9 where a blind via 14, a blind via 15 and a through via 16 are shown.

Figure 10:
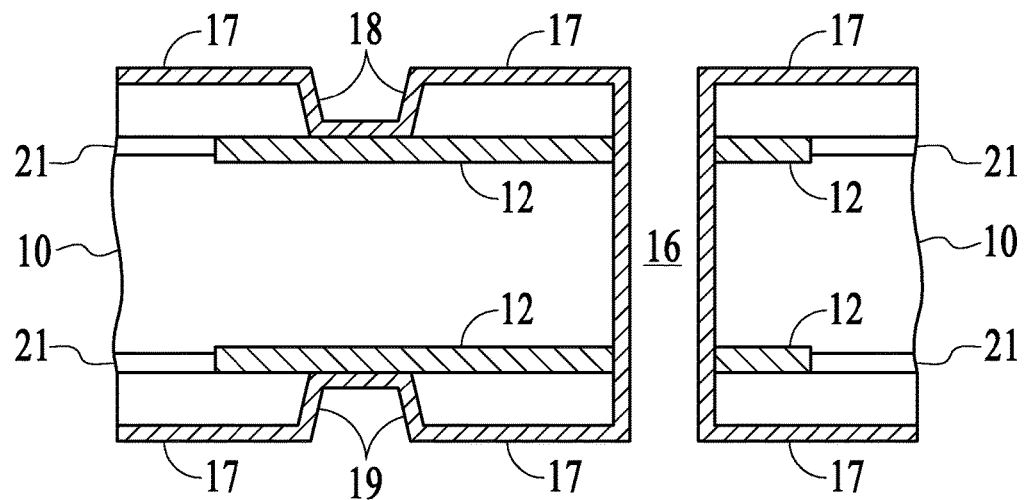

After an ultrasonic cleaning in water, in a block 38, traces 17 are formed. For example traces 17 are a metal, such as copper. For example, traces 17 are formed by electroless copper plating. The electroless copper plating will result in traces being formed within vias 14, 15 and 16, as illustrated by trace regions 18, 19 and 20, respectively. This results in the four layer board structure shown in FIG. 10. For example, the PCB may be finished by performing processing steps such as applying a solder mask, selective gold plating, singulation (i.e., depaneling from an array) and inspection.

Alternatively, in a block 39, additional layers may be added by repeating blocks 36, 37 and 38 as often as necessary to reach the desired numbers of layers. When the desired numbers of layers are reached, in a block 40, the PCB may be finished by performing such processing steps such as applying a solder mask, selective gold plating, singulation (i.e., depaneling PCBs from an array) and inspection.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A method for forming a printed circuit board, comprising:
    forming a laminate substrate, including
        forming catalytic powder by contacting a salt of a metal with clay and a reducing agent,
        dispersing the catalytic powder into a resin,
        impregnating a glass cloth with the resin to form catalytic core material, and
        encompassing the catalytic core material in non-catalytic material so that the laminate substrate resists metal plating except where catalytic core material is exposed, so that the catalytic powder is dispersed throughout a central core of the substrate while the surface of the substrate is encompassed in non-catalytic material;
    forming channels in the laminate substrate that extend through the non-catalytic material and expose the catalytic core material;
    immersing the laminate substrate in a metal bath so that the metal plates within the trace channels where the catalytic core material is exposed; and,
    planarizing the laminate substrate so that metal plated within the trace channel is flush with a surface of the laminate substrate.

2. A method as in claim 1 wherein the metal bath is an electroless copper bath.

3. A method as in claim 1 wherein the trace channels are formed using laser ablation.

4. A method as in claim 1 wherein the trace channels are formed by:
    applying resist over the laminate substrate;
    exposing and developing the resist to delineate locations of the channels; and, performing plasma etching to form the channels.

5. A method as in claim 1 wherein the trace channels are formed by:
    applying foil over the laminate substrate;
    applying resist over the foil;
    exposing and developing the resist to expose portions of the foil that delineate locations of the channels;
    etching the exposed portions of the foil; and,
    performing plasma etching to form the channels.

6. A method as in claim 1, additionally comprising:
    laminating a resin rich catalytic prepreg material on the laminate substrate;
    forming vias; and,
    forming additional traces on the surface of the resin rich catalytic prepreg material, including forming traces within the vias.

7. A method as in claim 1 wherein forming trace channels in the laminate substrate includes forming trace channels on both sides of the laminate substrate.

8. A method as in claim 1 wherein the catalytic powder includes palladium catalytic particles.

9. A method as in claim 1 wherein the catalytic powder includes silver.

10. A method as in claim 1 wherein the non-catalytic material comprises glass reinforced prepreg.

11. A method as in claim 1 wherein the trace channels are formed by one of the following:
    high pressure water cutting;
    drilling;
    routing.

12. A method for forming embedded traces, comprising:
    forming a substrate, including
        forming catalytic powder by contacting a salt of a metal with clay and a reducing agent,
        dispersing the catalytic powder into a resin,
        using the resin to form catalytic core material, and
        encompassing the catalytic core material in non-catalytic material so that the substrate resists metal plating except where the catalytic core material is exposed, so that the catalytic powder is dispersed throughout a central core of the substrate while the surface of the substrate is encompassed in non-catalytic material;
    forming channels in the laminate substrate that extend through the non-catalytic material and expose the catalytic core material;
    immersing the substrate in a metal bath so that the metal plates within the trace channels where the catalytic core material is exposed; and,
    planarizing the substrate so that metal plated within the trace channel is flush with a surface of the substrate.

13. A method as in claim 12 wherein the metal bath is an electroless copper bath.

14. A method as in claim 12 wherein the trace channels are formed using laser ablation.

15. A method as in claim 12 wherein the trace channels are formed by:
    applying resist over the substrate;
    exposing and developing the resist to delineate locations of the channels; and,
    performing plasma etching to form the channels.

16. A method as in claim 12 wherein the trace channels are formed by:
    applying foil over the substrate;
    applying resist over the foil;
    exposing and developing the resist to expose portions of the foil that delineate locations of the channels;
    etching the exposed portions of the foil; and,
    performing plasma etching to form the channels.

17. A method as in claim 12, additionally comprising:
    applying a resin rich catalytic prepreg material on the substrate;
    forming vias; and, forming additional traces on the surface of the resin rich catalytic prepreg material, including forming traces within the vias.

18. A method as in claim 12 wherein forming trace channels in the substrate includes forming trace channels on both sides of the substrate.

19. A method as in claim 12 wherein the catalytic powder includes one of the following:
palladium catalytic particles;
silver.

20. A method as in claim 12 wherein the non-catalytic material comprises glass reinforced prepreg.

\* \* \* \* \*